US008058714B2

(12) United States Patent
Noll et al.

(10) Patent No.: US 8,058,714 B2
(45) Date of Patent: Nov. 15, 2011

(54) OVERMOLDED SEMICONDUCTOR PACKAGE WITH AN INTEGRATED ANTENNA

(75) Inventors: Thomas Noll, Aliso Viejo, CA (US); Gye-An Lee, Robins, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 491 days.

(21) Appl. No.: 12/284,938

(22) Filed: Sep. 25, 2008

(65) Prior Publication Data

US 2010/0073255 A1  Mar. 25, 2010

(51) Int. Cl.
*H01L 23/02* (2006.01)
*H01Q 1/40* (2006.01)

(52) U.S. Cl. ............ 257/678; 343/873; 343/700 MS; 343/702; 257/782

(58) Field of Classification Search .......... None
See application file for complete search history.

(56) References Cited

U.S. PATENT DOCUMENTS

| | | | | |
|---|---|---|---|---|
| 5,907,477 | A * | 5/1999 | Tuttle et al. | 361/760 |
| 6,770,955 | B1 * | 8/2004 | Coccioli et al. | 257/659 |
| 6,818,985 | B1 * | 11/2004 | Coccioli et al. | 257/728 |
| 7,369,090 | B1 | 5/2008 | Beard | |
| 7,372,408 | B2 * | 5/2008 | Gaucher et al. | 343/700 MS |
| 2002/0089456 | A1 * | 7/2002 | Hamada | 343/702 |
| 2004/0217472 | A1 | 11/2004 | Aisenbrey et al. | |
| 2006/0071308 | A1 * | 4/2006 | Tang et al. | 257/675 |
| 2008/0259585 | A1 | 10/2008 | Fujii | |
| 2009/0295675 | A1 * | 12/2009 | Tang | 343/873 |

FOREIGN PATENT DOCUMENTS

KR  10-2008-0028782 A  4/2008

OTHER PUBLICATIONS

Su, et al., *Wideband Monopole Antenna Integrated Within the Front-End Module Package*, IEEE Transactions on Antennas and Propagation, vol. 54, No. 6, 1888-1891 (Jun. 2006).
Tentzeris, et al., *3-D-Integrated RF and Millimeter-Wave Functions and Modules Using Liquid Crystal Polymer (LCP) System-on-Package Technology*, IEEE Transactions on Advanced Packaging, vol. 27, No. 2, 332-340 (May 2004).
Pham, et al., *Minimized Dual-Band Coupled Line Meander Antenna for System-In-a-Package Applications*, IEEE, 1451-1454 (2004).

* cited by examiner

Primary Examiner — Trinh Dinh
(74) Attorney, Agent, or Firm — Lando & Anastasi, LLP

(57) ABSTRACT

According to an exemplary embodiment, an overmolded semiconductor package includes at least one semiconductor die situated over a package substrate. The overmolded semiconductor package further includes a mold compound overlying the at least one semiconductor die and the package substrate. The overmolded semiconductor package further includes a conductive layer situated on an outer surface of the mold compound and having an opening. The overmolded semiconductor package further includes an antenna feed line situated in the mold compound and having a portion exposed in the opening in the conductive layer, thereby providing an antenna input on the outer surface of the mold compound.

20 Claims, 4 Drawing Sheets

OVERMOLDED SEMICONDUCTOR PACKAGE WITH AN INTEGRATED ANTENNA

BACKGROUND OF THE INVENTION

1. Field of the Invention

The present invention generally relates to the field of semiconductors. More particularly, the invention relates to the fabrication of semiconductor packages.

2. Background Art

Mobile communication devices, such as cell phones, include antennas for receiving and transmitting voice and data information. These antennas are typically coupled to front-end modules, which can be encapsulated in an overmolded semiconductor package and housed on printed circuit boards in the mobile communication devices. However, consumer demand continues to increase for small-size, feature-rich mobile communication devices, such as cell phones, at competitive prices. As a result, manufacturers of cell phones and other communication devices are continually challenged to find a low-cost, small-size antenna.

In one conventional approach, an antenna can be fabricated on a main printed circuit board in a mobile communication device, such as a cell phone. Although having a low fabrication cost, the antenna provided in this conventional approach consumes valuable area on the main printed circuit board, which is undesirable. In another conventional approach, an antenna can be formed by extending a wire along the inside edge of a mobile communication device and soldering the wire to a module that is mounted on a main printed circuit board. However, in this conventional approach, the additional cost associated with assembling the wire antenna is undesirable.

SUMMARY OF THE INVENTION

Overmolded semiconductor package with an integrated antenna, substantially as shown in and/or described in connection with at least one of the figures, as set forth more completely in the claims.

DETAILED DESCRIPTION OF THE INVENTION

The present invention is directed to an overmolded semiconductor package with an integrated antenna. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention and are not drawn to scale. To maintain brevity, other embodiments of the invention which use the principles of the present invention are not specifically described in the present application and are not specifically illustrated by the present drawings.

Figure 1A:
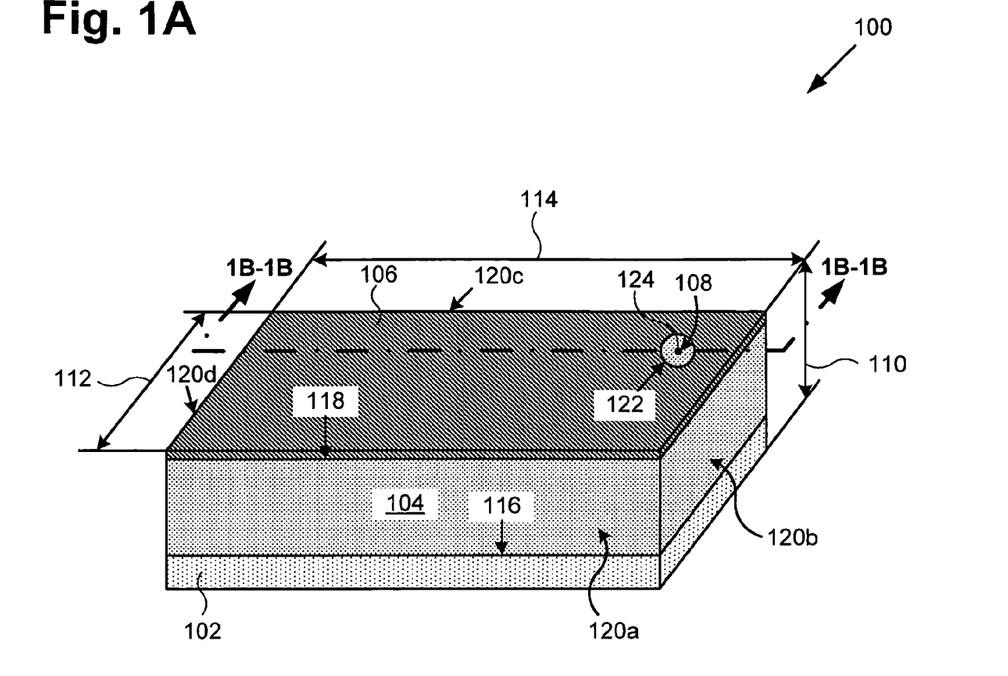
FIG. 1A shows a perspective view of an exemplary overmolded semiconductor packaging including an exemplary antenna input, in accordance with one embodiment of the present invention.

FIG. 1A shows a perspective view of overmolded semiconductor package 100 in accordance with one embodiment of the present invention. Certain details and features have been left out of FIG. 1A that are apparent to a person of ordinary skill in the art. Overmolded semiconductor package 100 can be, for example, a land grid array (LGA) package and includes package substrate 102, mold compound 104, conductive layer 106, and antenna feed line 108. Overmolded semiconductor package 100 can also include semiconductor dies, passive components, such as surface mount components, bond pads, and input/output (I/O) pads, which are not shown in FIG. 1A. An antenna (not shown in FIG. 1A) can be mounted over conductive layer 106 and coupled to antenna feed line 108. Overmolded semiconductor package 100 can be utilized in, for example, a mobile communication device, such as a cell phone. However, overmolded semiconductor package 100 can also be utilized in other types of electronic devices that have an antenna.

As shown in FIG. 1A, overmolded semiconductor package 100 has thickness 110, width 112, and length 114. Thickness 110 can be, for example, between 0.5 millimeter (mm) and 1.0 mm in one embodiment. Width 112 and length 114 can each be, for example, between 7.0 mm and 8.0 mm in one embodiment. Also shown in FIG. 1A, mold compound 104 is situated over top surface 116 of package substrate 102. Mold compound 104 has top surface 118 and side surfaces 120a, 120b, 120c, and 120d (hereinafter "side surfaces 120a through 120d) and can comprise, for example, a silica-filled epoxy or other type of molding or encapsulation material. Top surface 118 and side surfaces 120a through 120d can each be also referred to as an "outer surface" in the present application. Package substrate 102 can be, for example, a laminate or ceramic substrate or a substrate comprising a mixture of laminate and ceramic material and can include conductive vias (not shown in FIG. 1A). In one embodiment, package substrate 102 can be a multilayer laminate substrate and can include conductive vias and one or more metal layers. Package substrate 102 can comprise, for example, a polymer, such as bismaleimide triazine (BT), in one embodiment. In other embodiments of the present invention, package substrate 102 can comprise a glass reinforced resin or an epoxy, such as grade FR4 epoxy.

Further shown in FIG. 1A, conductive layer 106 is situated over top surface 116 of mold compound 104 and has opening 122. In one embodiment, conductive layer 106 can comprise a conductive paint, which can comprise, for example, an epoxy or silicon with silver particles, copper particles, or other metal particles. In one embodiment, conductive layer 106 can comprise a metal layer, which can comprise, for example, silver, copper, or other metal. In one embodiment, conductive layer 106 can be formed, for example, by depositing a layer of conductive paint over top surface 118 of mold compound 104 by utilizing a spraying process, a screen printing process, or other paint deposition process. In another embodiment, conductive layer 106 can be formed, for example, by depositing a layer of metal over top surface 118 of mold compound 104 by utilizing a plating process or other metal deposition process. After conductive layer 106 has been formed, opening 122 can be formed, for example, by utilizing an ablation process, such as a plasma, laser, or mechanical ablation process, to remove a selected portion of conductive layer 106 in an embodiment. In one embodiment, opening 122 can be formed, for example, by utilizing a microabrasion process.

Also shown in FIG. 1A, antenna feed line 108 is situated in mold compound 104 and includes portion 124, which is exposed on top surface 118 of mold compound 104 in opening 122 of conductive layer 106. Antenna feed line 108 is situated in mold compound 104 and can be coupled to, for example, a bond pad (not shown in FIG. 1A) on top surface 116 of package substrate 102 in one embodiment. In one embodiment, antenna feed line 108 can be coupled to, for example, a bond pad on a semiconductor die (not shown in FIG. 1A) situated on top surface 116 of package substrate 102. Portion 124 of antenna feed line 108 forms an antenna input for overmolded semiconductor package 100. Portion 124 of antenna feed line 108 can be exposed on top surface 118 of mold compound 104 in opening 122 of conductive layer 106 by utilizing an ablation process, such as a plasma, laser, or mechanical ablation process, to remove a portion of conductive layer 106 and an appropriate amount of molding material after formation of conductive layer 106. Portion 124 of antenna feed line 108 provides an antenna connection point (i.e. an antenna input) for coupling an antenna to overmolded semiconductor package 100.

Figure 1B:
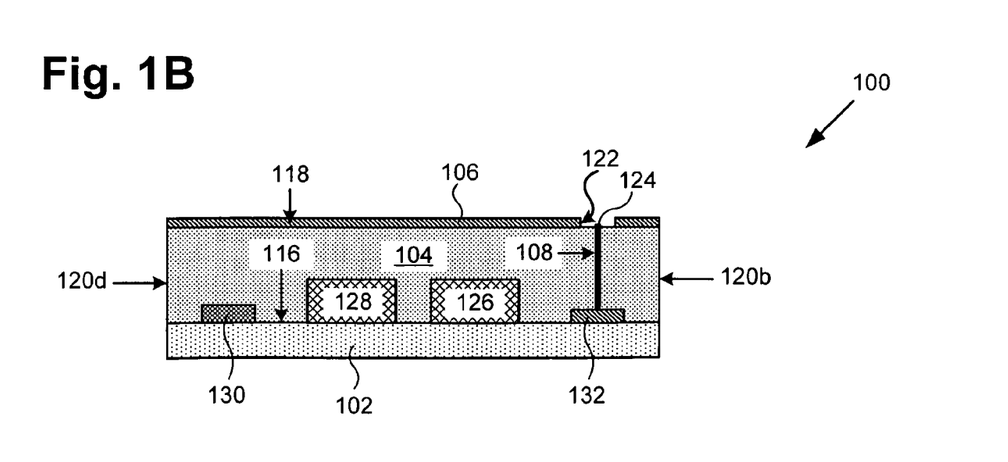
FIG. 1B shows a cross-sectional view of the exemplary overmolded semiconductor package of FIG. 1A.

FIG. 1B shows a cross-sectional view of overmolded semiconductor package 100 in FIG. 1A along line 1B-1B in FIG. 1A. In particular, package substrate 102, mold compound 104, conductive layer 106, antenna feed line 108, top surfaces 116 and 118, opening 122, and portion 124 of antenna feed line 108 correspond to the same elements in FIG. 1A and FIG. 1B. Overmolded semiconductor package 100 includes package substrate 102, mold compound 104, conductive layer 106, antenna feed line 108, semiconductor dies 126 and 128 (hereinafter referred to simply as "dies 126 and 128"), surface mount component 130, and bond pad 132.

As shown in FIG. 1B, dies 126 and 128, surface mount component 130, and bond pad 132 are situated on top surface 116 of package substrate 102. In one embodiment, dies 126 and 128 can each be attached to package substrate 102 by, for example, a die attach material and can be coupled to bond pads (not shown in FIG. 1B) on top surface 116 of package substrate 102. In another embodiment, dies 126 and 128 can each be coupled to package substrate 102 in a flip chip configuration, wherein the active surface of the die is coupled to package substrate 102 by solder bumps. Surface mount component 130 can be, for example, a passive component, such as capacitor, resistor, or inductor. Bond pad 132 can comprise copper, aluminum, gold, or other suitable metal or metal stack and can be formed on top surface 116 of package substrate 102 in a manner known in the art.

Also shown in FIG. 1B, antenna feed line 108 is situated on and electrically coupled to bond pad 132 and includes portion 124, which is exposed on top surface 118 of mold compound 104. In one embodiment, antenna feed line 108 can be coupled to a bond pad on a semiconductor die, such as die 126 or die 128. Antenna feed line 108 can comprise, for example, a metal wire, such as a gold or copper wire, in one embodiment. In one embodiment, antenna feed line 108 can comprise a metal wire, such as a gold or copper wire, that forms a loop between two bond pads on top surface 116 of package substrate 102, wherein portion 124 of antenna feed line 108 is situated at an apex of the loop. In other embodiments, antenna feed line 108 can comprise, for example, a post comprising a metal, a conductive polymer, or other type of conductive material. Antenna feed line 108 can be formed, for example, by bonding a metal wire to bond pad 132 by utilizing a wire bonding process in one embodiment. In one embodiment, antenna feed line 108 can be surrounded by a metal cage comprising a number of metal wires, where the metal cage can be coupled to an AC ground on package substrate 102 so as to form an electrical shield around antenna feed line 108 in mold compound 104.

Further shown in FIG. 1B, mold compound 104 is situated over top surface 116 of package substrate 102, dies 126 and 128, surface mount component 130, and bond pad 132 and surrounds and encapsulates antenna feed line 108. Also shown in FIG. 1B, conductive layer 106 is situated on top surface 118 of mold compound 104 and includes opening 122. In one embodiment, conductive layer 106 can be coupled to an AC ground on package substrate 102 by, for example, a metal wire that extends from a ground pad (not shown in FIG. 1B) on top surface 116 of package substrate 102 to conductive layer 106. In such embodiment, conductive layer 106 can form a ground plane for an antenna that is mounted over conductive layer 106 and can also form an electrical shield for the antenna input formed by portion 124 of antenna feed line 108.

Further shown in FIG. 1B, portion 124 of antenna feed line 108 is exposed at top surface 118 of mold compound 104 and situated in opening 122 in conductive layer 106. In one embodiment, a conductive layer, such as conductive layer 106, can be situated on a side surface of mold compound 104, such as side surfaces 120b or 120d. In such embodiment, an antenna feed line, such as antenna feed line 108, can be formed such that a portion of it (i.e. the antenna feed line) is exposed on the side surface of mold compound 104 in an opening in the conductive layer, thereby forming an antenna input on the side surface of mold compound 104.

Thus, in the embodiment of the invention in FIGS. 1A and 1B, portion 122 of antenna feed line 108 provides an antenna input for overmolded semiconductor package 100 on top surface 118 of mold compound 104. The antenna input provided by exposed portion 122 of antenna feed line 108 can be coupled to an antenna in an electronic device in which overmolded semiconductor package 100 resides, such as a cell phone or other mobile communication device. Since the antenna input provided by exposed portion 122 of antenna feed line 108 is situated on an outer surface of the mold compound, it (i.e. the antenna input) provides a readily accessible antenna input that can be easily and effectively coupled to an external antenna.

Figure 2A:
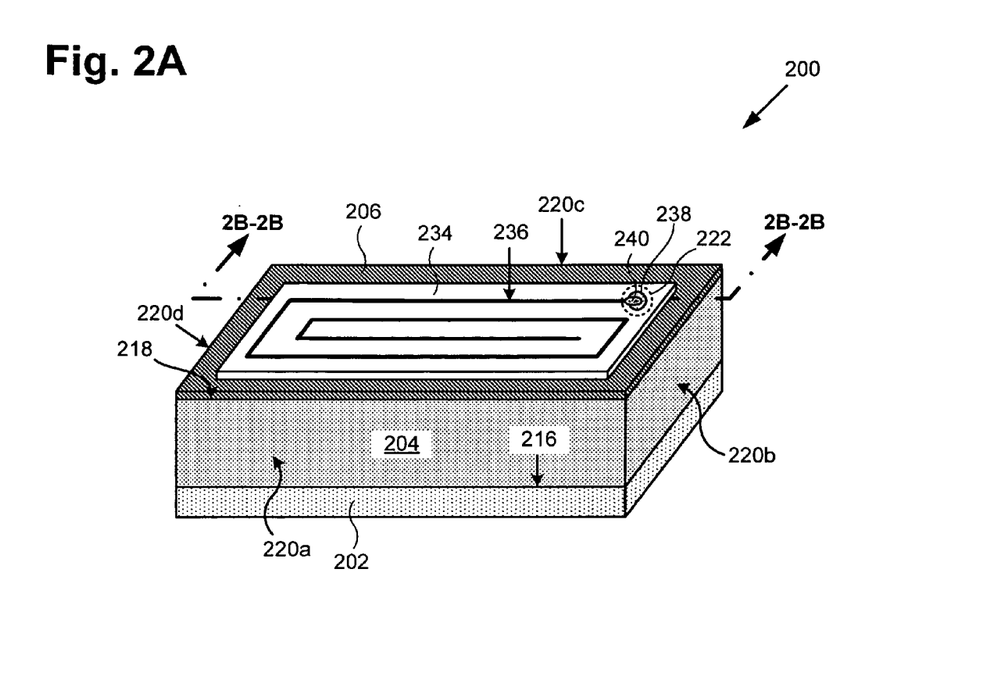
FIG. 2A shows a perspective view of an exemplary overmolded semiconductor packaging including an exemplary antenna, in accordance with one embodiment of the present invention.

FIG. 2A shows a perspective view of overmolded semiconductor package 200 in accordance with one embodiment of the present invention. Certain details and features have been left out of FIG. 2A that are apparent to a person of ordinary skill in the art. In overmolded semiconductor package 200, package substrate 202, mold compound 204, conductive layer 206, top surface 216, top surface 218, side surfaces 220a, 220b, 220c, and 220d, and opening 222 correspond, respectively, to package substrate 102, mold compound 104, conductive layer 106, top surface 116, top surface 118, side surfaces 120a, 120b, 120c, and 120d, and opening 122 in overmolded semiconductor package 100 in FIGS. 1A and 1B. Overmolded semiconductor package 200 includes package substrate 202, mold compound 204, conductive layer 206, insulative layer 234, and antenna 236. In FIG. 2A, insulative layer 234 and antenna 236 have been added to overmolded semiconductor package 100 to form overmolded semiconductor package 200.

As shown in FIG. 2A, mold compound 204 is situated over top surface 216 of package substrate 202 and insulative layer 234 is situated over conductive layer 206. Insulative layer 234 can comprise, for example, a polymer, such as polyimide or a liquid crystal polymer, in one embodiment. In another embodiment, insulative layer 234 can comprise silicon oxide or other dielectric material. Insulative layer 234 can be formed, for example, by depositing a polymer, such as polyimide or a liquid crystal polymer, over conductive layer 206 by utilizing a spraying process or other suitable type of deposition process. After insulative layer 234 has been formed, hole 238 can be formed in insulative layer 234 over opening 222 in conductive layer 206 so as to expose a portion of an antenna feed line (not shown in FIG. 2A).

Also shown in FIG. 2A, antenna 236 is situated on insulative layer 234 and can comprise, for example, copper, gold, or other metal. In one embodiment, antenna 236 can have a spiral shape. In other embodiments, antenna 236 can comprise a single line, a loop, or have a specific shape so as to meet particular frequency and/or application requirements. Antenna 236 can be formed, for example, by depositing a layer of metal on insulative layer 234 by using a spraying process, a plating process, or other suitable deposition process, and appropriately patterning the layer of metal. Further shown in FIG. 2A, bonding material 240 electrically couples antenna 236 to an antenna feed line (not shown in FIG. 2A) situated in mold compound 204. Bonding material 240 can comprise, for example, a conductive polymer. In one embodiment, bonding material 240 can comprise solder.

In one embodiment, conductive layer 206 can be appropriately patterned to form antenna 236, which can be electrically coupled to an antenna feed line (not shown in FIG. 2A) by using a bonding material, such as a conductive polymer or solder. In such embodiment, antenna 236 can be situated directly on top surface 218 of mold compound 204. In one embodiment, an insulative layer having an overlying antenna, such as antenna 236, can be attached to top surface 218 of mold compound 204 by using an epoxy or other adhesive material and the antenna can be electrically coupled to an exposed portion of an antenna feed line (not shown in FIG. 2A) by using a bonding material, such as a conductive polymer or solder.

Figure 2B:
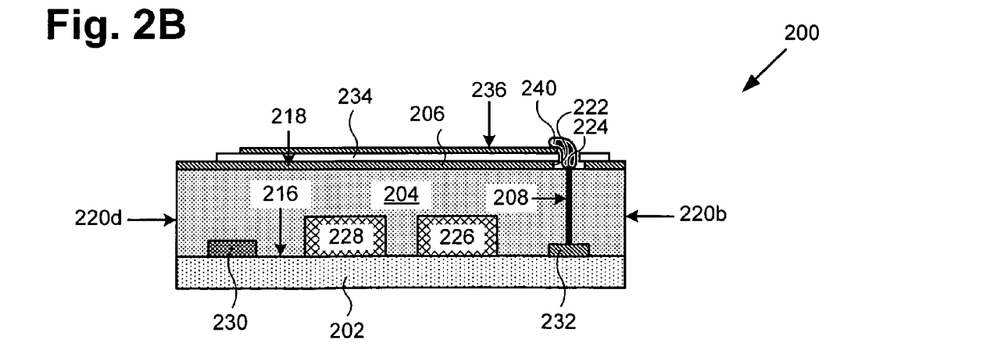
FIG. 2B shows a cross-sectional view of the exemplary overmolded semiconductor package of FIG. 2A.

FIG. 2B shows a cross-sectional view of overmolded semiconductor package 200 in FIG. 2A along line 2B-2B in FIG. 2A. In particular, package substrate 202, mold compound 204, conductive layer 206, top surfaces 216 and 218, opening 222, insulative layer 234, antenna 236, and bonding material 240 correspond to the same elements in FIG. 2A and FIG. 2B. Also, in FIG. 2B, antenna feed line 208, portion 224, dies 226 and 228, surface mount component 230, bond pad 232 in overmolded semiconductor package 200 correspond, respectively to antenna feed line 108, portion 124, dies 126 and 128, surface mount component 130, bond pad 132 in overmolded semiconductor package 100 in FIG. 1B.

As shown in FIG. 2B, dies 226 and 228, surface mount component 230, and bond pad 232 are situated on top surface 216 of package substrate 202. Also shown in FIG. 2B, antenna feed line 208 is situated on and electrically coupled to bond pad 232 and includes portion 224 which is exposed on top surface 218 of mold compound 204. Further shown in FIG. 2B, mold compound 204 is situated over top surface 216 of package substrate 202, dies 226 and 228, surface mount component 230, and bond pad 232 and surrounds and encapsulates antenna feed line 208. Also shown in FIG. 2B, conductive layer 206 is situated on top surface 218 of mold compound 204 and includes opening 222. In one embodiment, conductive layer 206 can be coupled to an AC ground on package substrate 202 by, for example, a metal wire that extends from a ground pad (not shown in FIG. 2B) on top surface 216 of package substrate 206 to conductive layer 206. In such embodiment, conductive layer 206 can form a ground plane for antenna 236.

Further shown in FIG. 2B, portion 224 of antenna feed line 208 is exposed at top surface 218 of mold compound 204 and situated in opening 222 in conductive layer 206. Also shown in FIG. 2B, insulative layer 234 is situated on conductive layer 206 and includes opening 238, and antenna 236 is situated on insulative layer 234. Further shown in FIG. 2B, antenna 236 is electrically coupled to portion 224 of antenna feed line 208 by bonding material 240. Insulative layer 234 forms an electrical shield between dies 226 and 228 on package substrate 202 and antenna 236.

In one embodiment, a conductive layer, such as conductive layer 206, can be situated on a side surface of mold compound 204, such as side surfaces 220b or 220d. In such embodiment, an antenna feed line, such as antenna feed line 208, can be formed such that a portion of it (i.e. the antenna feed line) is exposed in an opening in the conductive layer on the side surface of mold compound 204. An insulative layer, such as insulative layer 234 can be formed over the conductive layer and an antenna, such as antenna 236, can be formed on the insulative layer on the side surface of mold compound 204.

Thus, in the embodiment of the invention in FIGS. 2A and 2B, overmolded semiconductor package 200 includes antenna 236, which is formed over a top surface of mold compound 204 and coupled to a bond pad on package substrate 202 by antenna feed line 208 situated in mold compound 204. By forming an antenna on a top surface of a mold compound, an embodiment of the invention's overmolded semiconductor package 200 provides an integrated antenna that does not significantly increase the size of the overmolded semiconductor package or consume valuable space on the package substrate. Also, by providing an integrated antenna, an embodiment of the invention in FIGS. 2A and 2B avoids the cost associated with assembling and coupling an external antenna to the overmolded semiconductor package.

Figure 3A:
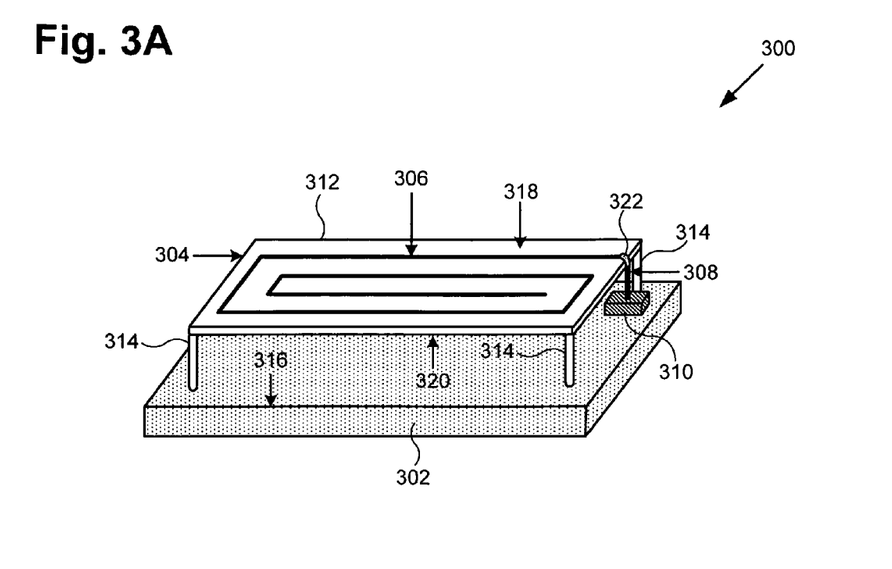
FIG. 3A shows a perspective view of an exemplary structure including an exemplary antenna situated on an exemplary support structure, in accordance with one embodiment of the present invention.
Figure 3B:
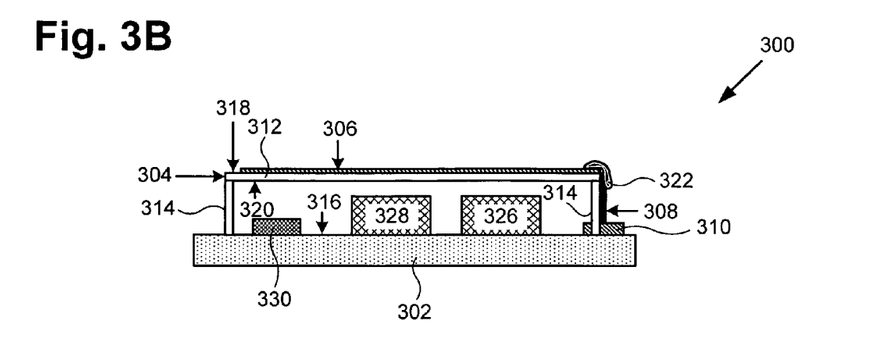
FIG. 3B shows a front view of the exemplary structure of FIG. 3A.
Figure 4A:
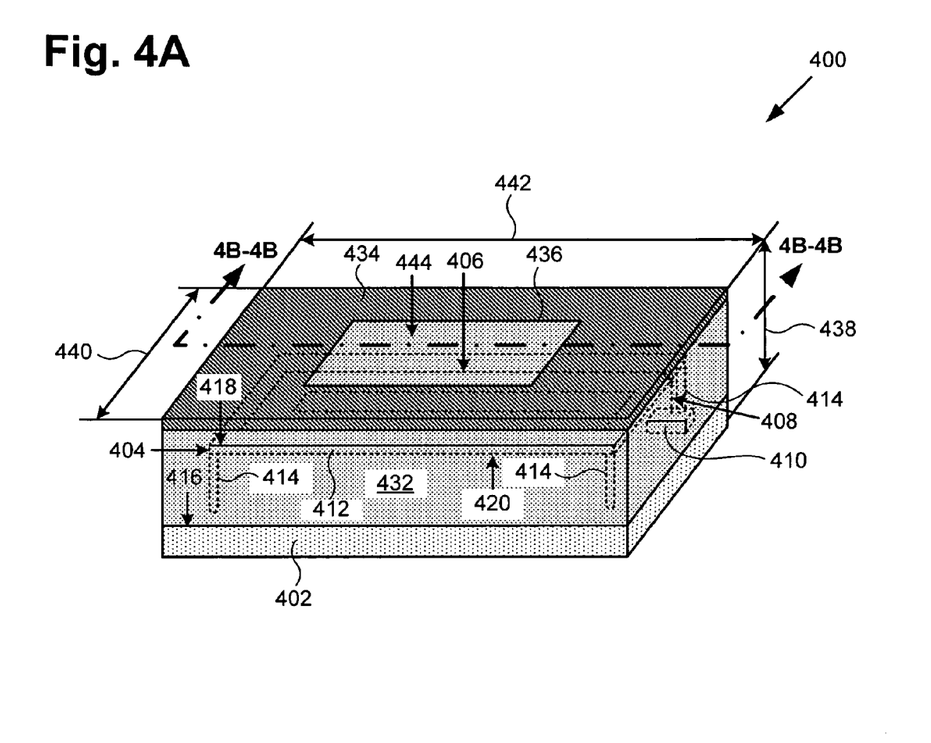
FIG. 4A shows a perspective view of an exemplary overmolded semiconductor packaging including an exemplary antenna situated on an exemplary support structure, in accordance with one embodiment of the present invention.
Figure 4B:
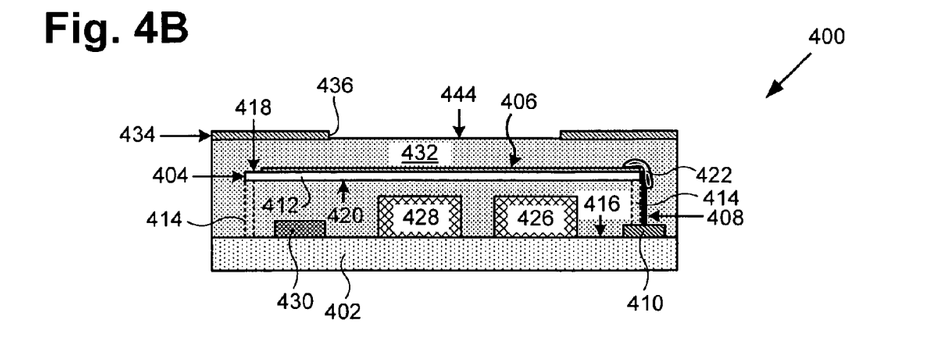
FIG. 4B shows a cross-sectional view of the exemplary overmolded semiconductor package of FIG. 4A.

FIG. 3A shows a perspective view of structure 300 in accordance with one embodiment of the present invention, that is illustrated and discussed further in relation to FIGS. 3B, 4A, and 4B. Certain details and features have been left out of FIG. 3A that are apparent to a person of ordinary skill in the art. Structure 300 shows a perspective view of an overmolded semiconductor package prior to encapsulation by a mold compound and formation of an overlying conductive layer. Structure 300 includes package substrate 302, support structure 304, antenna 306, antenna feed line 308, and bond pad 310. Support structure 304 includes platform portion 312 and legs 314. Structure 300 also includes semiconductor dies, passive components, such as surface mount components, additional bond pads, and input/output (I/O) pads, which are not shown in FIG. 3A.

As shown in FIG. 3A, support structure 304 and bond pad 310 are situated on top surface 316 of package substrate 302. Package substrate 302 is substantially similar in composition and formation to package substrate 102 in FIGS. 1A and 1B. Support structure 304 includes platform portion 312 and legs 314 and has top surface 318 and bottom surface 320. Platform portion 312 is supported by legs 314, which are substantially perpendicular to top surface 316 of package substrate 302. Support structure 304 can comprise, for example, a polymer, such as a liquid crystal polymer, in an embodiment. In one embodiment, support structure 304 can comprise polyimide. In other embodiments, support structure 304 can comprise glass, ceramic, or other non-conductive material. Support structure 304 can be formed, for example, by molding a polymer, such as a liquid crystal polymer or polyimide, into a desired shape by utilizing a molding process as known in the art. Bond pad 310 is substantially similar in composition and formation to bond pad 132 in FIG. 1B.

Also shown in FIG. 3A, antenna feed line 308 is situated on bond pad 310 and extends from bond pad 310 to top surface 318 of support structure 304. Antenna feed line 308 Antenna feed line 308 can comprise, for example, a metal wire, such as a gold or copper wire, in one embodiment. In one embodiment, antenna feed line 308 can comprise a metal wire, such as a gold or copper wire, that forms a loop between two bond pads on top surface 316 of package substrate 302, wherein an apex of the loop is situated at top surface 318 of support structure 304. In other embodiments, antenna feed line 308 can comprise, for example, a post comprising a metal, a conductive polymer, or other type of conductive material. Antenna feed line 308 can be formed, for example, by bonding a metal wire to bond pad 310 by utilizing a wire bonding process in one embodiment.

Further shown in FIG. 3A, antenna 306 is situated on top surface 318 of support structure 304 and is electrically connected to antenna feed line 308 by bonding material 322. In one embodiment, antenna 306 can be situated on bottom surface 320 of support structure 304. Antenna 306 can comprise, for example, copper, gold, or other metal. In one embodiment, antenna 306 can have a spiral shape. In other embodiments, antenna 306 can be shaped as a single line, a loop, or have a specific shape so as to meet particular frequency and/or application requirements. Antenna 306 can be formed, for example, by depositing a layer of metal on top surface 318 of support structure 304 by using a spraying process, a plating process, or other suitable deposition process, and appropriately patterning the layer of metal. Bonding material 322 can comprise, for example, a conductive polymer in an embodiment. In one embodiment, bonding material 322 can comprise solder.

FIG. 3B shows a front view of structure 300 in FIG. 3A. In particular, package substrate 302, support structure 304, antenna 306, antenna feed line 308, bond pad 310, platform portion 312, legs 314, top surfaces 316 and 318, bottom surface 320, and bonding material 322 correspond to the same elements in FIG. 3A and FIG. 3B. Structure 300 includes package substrate 302, support structure 304, antenna 306, antenna feed line 308, bond pad 310, semiconductor dies 326 and 328 (hereinafter referred to simply as "dies 326 and 328"), and surface mount component 330. In FIG. 3B, dies 326 and 328 and surface mount component 330 in structure 300 correspond, respectively, to dies 126 and 128 and surface mount component 130 in overmolded semiconductor package 100 in FIG. 1B.

As shown in FIG. 3B, bonding pad 310, surface mount component 330, and dies 326 and 328 are situated on top surface 316 of package substrate 302. Also shown in FIG. 3B, support structure 304 is situated on top surface 316 of package substrate 302 and also situated over bond pad 310, surface mount component 330, and dies 326 and 328. Further shown in FIG. 3B, antenna 306 is situated on top surface 318 of support structure 304 and antenna feed line 308 is situated on bond pad 310 and electrically connected to antenna 306 by bonding material 322.

Thus, in structure 300, antenna 306 is situated on support structure 304, which is situated over bond pad 310, surface mount component 330, and dies 326 and 328. Thus, since antenna 306 is over bond pad 310, surface mount component 330, and dies 326 and 328, it (i.e. antenna 306) does not consume valuable space on top surface 316 of package substrate 302. Structure 300 can be further processed in the present embodiment, as discussed below.

Continuing with the above embodiment of the invention described in relation to FIGS. 3A and 3B, FIG. 4A shows a perspective view of overmolded semiconductor package 400. Certain details and features have been left out of FIG. 4A that are apparent to a person of ordinary skill in the art. Overmolded semiconductor package 400 corresponds to structure 300 in FIGS. 3A and 3B after structure 300 has been encapsulation by a mold compound and a conductive layer has been formed over the mold compound. In particular, package substrate 402, support structure 404, antenna 406, antenna feed line 408, bond pad 410, platform portion 412, legs 414, top surfaces 416 and 418, bottom surface 420 in overmolded semiconductor package 400 in FIG. 4A correspond, respectively, to package substrate 302, support structure 304, antenna 306, antenna feed line 308, bond pad 310, platform portion 312, legs 314, top surfaces 316 and 318, bottom surface 320 in structure 300 in FIG. 3A. Overmolded semiconductor package 400 includes package substrate 402, support structure 404, antenna 406, antenna feed line 408, bond pad 410, mold compound 432, and conductive layer 434, which has opening 436. Overmolded semiconductor package 400 can be utilized in, for example, a mobile communication device, such as a cell phone. However, overmolded semiconductor package 400 can also be utilized in other types of electronic devices that require an antenna.

As shown in FIG. 4A, overmolded semiconductor package 400 has thickness 438, width 440, and length 442. Thickness 438 can be, for example, between 0.5 mm and 1.0 mm in one embodiment. Width 440 and length 442 can each be, for example, between 7.0 mm and 8.0 mm in one embodiment. Also shown in FIG. 4A, support structure 404, which includes platform portion 412 and legs 414, and bond pad 410 are situated on top surface 416 of package substrate 402. Further shown in FIG. 4A, antenna feed line 408 is situated on bond pad 410 and antenna 406 is situated on top surface 418 of support structure 404.

Also shown in FIG. 4A, mold compound 432 is situated over support structure 404, antenna 406, antenna feed line 408, bond pad 410, and top surface 416 of package substrate 402 and also situated under support structure 404. Thus, mold compound 432 encapsulates support structure 404, antenna 406, and antenna feed line 408. Mold compound 432 has top surface 444 and can comprise, for example, a silica-filled epoxy or other type of molding or encapsulation material. Mold compound 432 can be formed over support structure 404, antenna 406, antenna feed line 408, bond pad 410, and top surface 416 of package substrate 402 in a manner known in the art.

Further shown in FIG. 4A, conductive layer 434 is situated on top surface 444 of mold compound 432 and has opening 436, which is situated over antenna 406. In one embodiment, conductive layer 434 can comprise a conductive paint, which can comprise, for example, an epoxy or silicon with silver particles, copper particles, or other metal particles. In one embodiment, conductive layer 434 can comprise a metal layer, which can comprise, for example, silver, copper, or other metal. Conductive layer 434 can be formed, for example, by depositing a layer of conductive paint over top surface 444 of mold compound 432 by utilizing a spraying process, a screen printing process, or other paint deposition process in an embodiment. Conductive layer 434 can be formed, for example, by depositing a layer of metal over top surface 444 of mold compound 432 by utilizing a plating process or other metal deposition process in an embodiment. In one embodiment, conductive layer 434 may not be utilized. In one embodiment, conductive layer 434 can be coupled to an AC ground on package substrate 402 so as to form a ground plane on top surface 444 of mold compound 432. Opening 436 in conductive layer 434 can be formed, for example, by appropriately patterning a layer of conductive material, such as a layer of metal or a layer of conductive paint, utilized to form conductive layer 434. Opening 436 can allow electromagnetic radiation to be transmitter and/or received by antenna 406 through top surface 444 of mold compound 432.

FIG. 4B shows a cross-sectional view of overmolded semiconductor package 400 in FIG. 4A along line 4B-4B in FIG. 4A. In particular, package substrate 402, support structure 404, antenna 406, antenna feed line 408, bond pad 410, platform portion 412, legs 414, top surfaces 416, 418, and 444, bottom surface 420, mold compound 432, conductive layer 434, and opening 436 correspond to the same elements in FIG. 4A and FIG. 4B. Also, in FIG. 4B, bonding material 422, dies 426 and 428, and surface mount component 430 correspond, respectively, to bonding material 322, dies 326 and 328, and surface mount component 330 in structure 300 in FIG. 3B.

As shown in FIG. 4B, support structure 404, bond pad 410, surface mount component 430, and dies 426 and 428 are situated on top surface 416 of package substrate 402 and support structure 404 is situated over bond pad 410, surface mount component 430, and dies 426 and 428. Also shown in FIG. 4B, antenna feed line 408 is situated on bond pad 410 and also situated adjacent to platform portion 412 of support structure 404. Further shown in FIG. 4B, antenna 406 is situated on top surface 418 of support structure 404 and is electrically connected to antenna feed line 408 by bonding material 422. Also shown in FIG. 4B, mold compound 432 is situated over support structure 404, antenna 406, antenna feed line 408, bond pad 410, surface mount component 430, dies 426 and 428, and top surface 416 of package substrate 402, and also situated under support structure 404. Further shown in FIG. 4B, conductive layer 434 is situated on top surface 444 of mold compound 432 and has opening 436, which is situated over antenna 406.

Thus, in the embodiment of the invention in FIGS. 3A, 3B, 4A and 4B, overmolded semiconductor package 400 includes antenna 406, which is situated on support structure 404 and coupled to a bond pad on package substrate 402 by antenna feed line 408. By forming an antenna on a support structure that overlies the package substrate, an embodiment of the invention's overmolded semiconductor package 400 provides an integrated antenna that does not significantly increase the size of the overmolded semiconductor package or consume valuable space on the package substrate. Also, an embodiment of the invention's overmolded semiconductor package 400 provides an antenna that avoids an undesirable assembly cost associated with attaching an external antenna to an overmolded semiconductor package.

Thus, as discussed above, in an embodiment in FIGS. 1A and 1B, the invention provides an overmolded semiconductor package including a shielded antenna input pad on an outer surface of a mold compound, thereby enabling an external antenna to be easily and effectively coupled tot the overmolded semiconductor package. In an embodiment in FIGS. 2A and 2B, the invention provides an overmolded semiconductor package including an antenna situated on an outer surface of a mold compound. In an embodiment in FIGS. 3A, 3B, 4A and 4B, the invention provides an overmolded semiconductor package including an antenna situated on a support structure overlying a package substrate, wherein the antenna and the support structure are encapsulated in mold compound.

Furthermore, in each of the embodiments in FIGS. 2A, 2B, 3A, 3B, 4A and 4B, the invention also provides an overmolded semiconductor package that additionally includes an antenna that advantageously avoids significantly increasing the size of the overmolded semiconductor package and also advantageously avoids consuming space on the package substrate.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. An overmolded semiconductor package comprising:
at least one semiconductor die situated over a package substrate;
a mold compound overlying said at least one semiconductor die and said package substrate;
a conductive layer situated on an outer surface of said mold compound;
an antenna feed line situated in said mold compound and having a portion exposed in an opening in said conductive layer so as to provide an antenna input on said outer surface of said mold compound.

2. The overmolded semiconductor package of claim 1 further comprising an antenna situated over said conductive layer and connected to said antenna feed line.

3. The overmolded semiconductor package of claim 2 further comprising an insulative layer situated between said antenna and said conductive layer.

4. The overmolded semiconductor package of claim 2 further comprising a bond pad situated over said package substrate, wherein said antenna feed line couples said antenna to said bond pad.

5. The overmolded semiconductor package of claim 1 further comprising a bond pad situated over said package substrate, wherein said antenna feed line is coupled to said bond pad.

6. The overmolded semiconductor package of claim 1, wherein said antenna feed line is coupled to said at least one semiconductor die.

7. The overmolded semiconductor package of claim 1, wherein said conductive layer comprises a conductive polymer.

8. The overmolded semiconductor package of claim 1, wherein said conductive layer forms a ground plane on said outer surface of said mold compound.

9. The overmolded semiconductor package of claim 1, wherein said antenna feed line is electrically shielded in said mold compound.

10. The overmolded semiconductor package of claim 1, wherein said outer surface is a top surface of said mold compound.

11. An overmolded semiconductor package comprising:
at least one semiconductor die situated over a package substrate;
a support structure situated over said package substrate and said at least one semiconductor die;
an antenna situated on said support structure;
a mold compound overlying said at least one semiconductor die, said package substrate, and said support structure;
an antenna feed line situated in said mold compound; and
a conductive layer situated over a top surface of said mold compound, said conductive layer having an opening situated over said antenna.

12. The overmolded semiconductor package of claim 11, wherein said antenna feed line is coupled to said antenna.

13. The overmolded semiconductor package of claim 11, wherein said antenna feed line couples said antenna to said package substrate.

14. The overmolded semiconductor package of claim 11, wherein said antenna feed line couples said antenna to said at least one semiconductor die.

15. The overmolded semiconductor package of claim 11, wherein said antenna is situated on a top surface of said support structure.

16. The overmolded semiconductor package of claim 11, wherein said antenna is situated on a bottom surface of said support structure.

17. The overmolded semiconductor package of claim 11, wherein said mold compound is situated under said support structure.

18. The overmolded semiconductor package of claim 11, wherein said conductive layer includes a conductive paint.

19. The overmolded semiconductor package of claim 11, wherein said support structure includes a polymer.

20. An overmolded semiconductor package comprising:
at least one semiconductor die situated over a package substrate;
a support structure situated over said package substrate and said at least one semiconductor die, said support structure being formed of a polymer;
an antenna situated on said support structure;
a mold compound overlying said at least one semiconductor die, said package substrate, and said support structure; and
an antenna feed line situated in said mold compound.

* * * * *